(12) United States Patent
Loke et al.

(10) Patent No.: US 6,975,176 B2
(45) Date of Patent: Dec. 13, 2005

(54) SELF-TUNING VARACTOR SYSTEM

(75) Inventors: Alvin Leng Sun Loke, Fort Collins, CO (US); Robert Keith Barnes, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 52 days.

(21) Appl. No.: 10/717,834

(22) Filed: Nov. 20, 2003

(65) Prior Publication Data

US 2005/0110589 A1   May 26, 2005

(51) Int. Cl.$^7$ .............................. H03B 5/00; H03L 7/99
(52) U.S. Cl. ...................... 331/177 V; 331/14; 331/17; 331/18; 331/36 C; 331/2
(58) Field of Search ........................... 331/2, 8, 10, 11, 331/14, 16, 17, 18, 25, 36 C, 117 R, 117 FE, 331/117 D, 177 V, DIG. 2

(56) References Cited

U.S. PATENT DOCUMENTS

| | | | |
|---|---|---|---|
| 5,302,919 A | * | 4/1994 | Abe ............................... 331/2 |
| 5,594,388 A | | 1/1997 | O'Shaughnessy et al. |
| 5,696,468 A | | 12/1997 | Nise |
| 6,114,920 A | | 9/2000 | Moon et al. |
| 6,133,797 A | | 10/2000 | Lovelace et al. |
| 6,175,282 B1 | * | 1/2001 | Yasuda ........................ 331/44 |
| 6,323,736 B2 | | 11/2001 | Jansson |
| 6,504,437 B1 | * | 1/2003 | Nelson et al. ................ 331/14 |
| 6,552,618 B2 | | 4/2003 | Nelson et al. |
| 6,566,966 B1 | * | 5/2003 | Bellaouar et al. ............. 331/10 |

* cited by examiner

*Primary Examiner*—David Mis

(57) ABSTRACT

In one embodiment, the present invention provides a system including a varactor and a voltage generator. The varactor includes a set of substantially equal voltage-tunable capacitor cells, each having a capacitive range that varies with a first plurality of operating parameters and each providing a capacitance within the range based on a voltage level of a reference voltage. The voltage generator is configured to provide the reference voltage, wherein the voltage level of the reference voltage corresponds to a desired capacitance within the capacitive range and varies based on a second plurality of operating parameters which are substantially the same as the first plurality of operating parameters, and wherein the voltage level of the reference voltage causes each capacitor cell to provide the desired capacitance.

25 Claims, 2 Drawing Sheets

SELF-TUNING VARACTOR SYSTEM

BACKGROUND

Varactors are voltage-tunable capacitors whose capacitance varies as a function of an applied voltage. Varactors often comprise multiple voltage-tunable capacitor cells, with each cell having a capacitive range, wherein the net capacitive range of the varactor is substantially equal to a sum of the capacitive ranges of the individual capacitor cells. Examples of varactors in monolithic integrated circuit implementations include a varactor diode employing a p-n junction in reverse bias, and a metal-oxide semiconductor (MOS) inversion mode varactor.

Varactors are commonly employed in voltage-controlled oscillators (VCO's) as the principal control element for tuning the output frequency of an analog or mixed-signal phase-locked loop (PLL) so as to match an input reference frequency. A PLL is a negative feedback control system for matching the phase of a generated output clock to that of an input reference clock. For PLL's with low jitter requirements, such as those utilized in high-speed serial data transmission, both coarse and fine control of the VCO are required, as a single line control is generally not sufficient. For coarse and fine control, the capacitor cells of the VCO's varactor are segregated into two groups, with one group controlled via a coarse control input and the other via a fine control input, wherein the net capacitance of the coarse control group is generally much larger relative to the net capacitance of the fine control group.

Coarse control provides the tuning range necessary for the PLL to lock to its input reference amidst process, power supply voltage, and temperature (PVT) fluctuations; uncertainties in circuit modeling during the design process, and flexibility to adjust the input reference frequency for system test purposes. Fine control, with its smaller effect on the VCO output, allows the PLL to track small perturbations in input and voltage-temperature conditions during normal operation while providing high immunity again circuit noise that principally dictate jitter performance.

In a PLL employing coarse and fine control of a varactor-tuned VCO, a calibration procedure is invoked prior to normal operation. During the calibration procedure, the PLL is "opened", and capacitance is incrementally added or subtracted from the coarse control group to arrive at a net capacitance that causes the VCO to generate a frequency that is within the PLL's frequency capture range. By doing so, the PLL should be able to track input perturbations using only fine control.

During the calibration process, the fine control reference signal should ideally be set to a voltage level that will cause the associated group of fine control varactor capacitor cells to be centered with respect to the net capacitive tuning range of the group. By being centered within its capacitive tuning range, the fine control group of capacitor cells provides the varactor/VCO with maximum bi-directional tunability as well as gain linearity. However, due to PVT fluctuations, establishing this ideal, or "centered", fine control reference voltage is not a trivial procedure. This is especially true for varactors exhibiting non-linear capacitance-versus-voltage characteristics, such as MOS inversion-mode varactors.

Several techniques are employed to achieve a "centered" fine control reference voltage during the calibration procedure. One such technique employs a calibration algorithm to empirically determine the fine control tuning range. There are variations in such algorithms, but one algorithm is described generally as follows:

a. Force the fine control reference voltage, $V_{FINE}$, to one extreme, for instance, $V_{FINE, MIN}$.
b. Determine the coarse control voltage difference, $\Delta V_{COARSE,FINE}$, corresponding to the entire voltage tuning range of the fine control, $\Delta V_{FINE, MAX} - \Delta V_{FINE, MIN}$.
c. Calibrate the coarse control to determine the correct coarse control reference voltage, $V_{COARSE}$, that sets the VCO frequency to match the input reference frequency.
d. Add a value equal to $\frac{1}{2} \times \Delta V_{COARSE,FINE}$ back to $\Delta V_{COARSE}$.
e. Close, or release, the PLL to lock to the input reference frequency. When the PLL achieves phase-lock, the fine control reference voltage will have drifted back from $V_{FINE, MIN}$ to an intermediate value, $V_{FINE, LOCK}$, that should be equal to the "centered" fine control reference voltage.

Though clever in overcoming PVT fluctuations, this technique adds significant complexity to the calibration procedure.

A second and much simpler technique involves using a resistive divider (e.g., two diode-connected transistors in series), which behave like resistors, and tapping the intermediate voltage. However, this technique is susceptible to PVT fluctuations since the PVT fluctuations in the voltage-dividing elements are not likely to track those of the varactor.

SUMMARY

One aspect of the present invention provides a system including a varactor and a voltage generator. The varactor includes a set of substantially equal voltage-tunable capacitor cells, each having a capacitive range that varies with a first plurality of operating parameters and each providing a capacitance within the range based on a voltage level of a reference voltage. The voltage generator is configured to provide the reference voltage, wherein the voltage level of the reference voltage corresponds to a desired capacitance within the capacitive range and varies based on a second plurality of operating parameters which are substantially the same as the first plurality of operating parameters, and wherein the voltage level of the reference voltage causes each capacitor cell to provide the desired capacitance.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
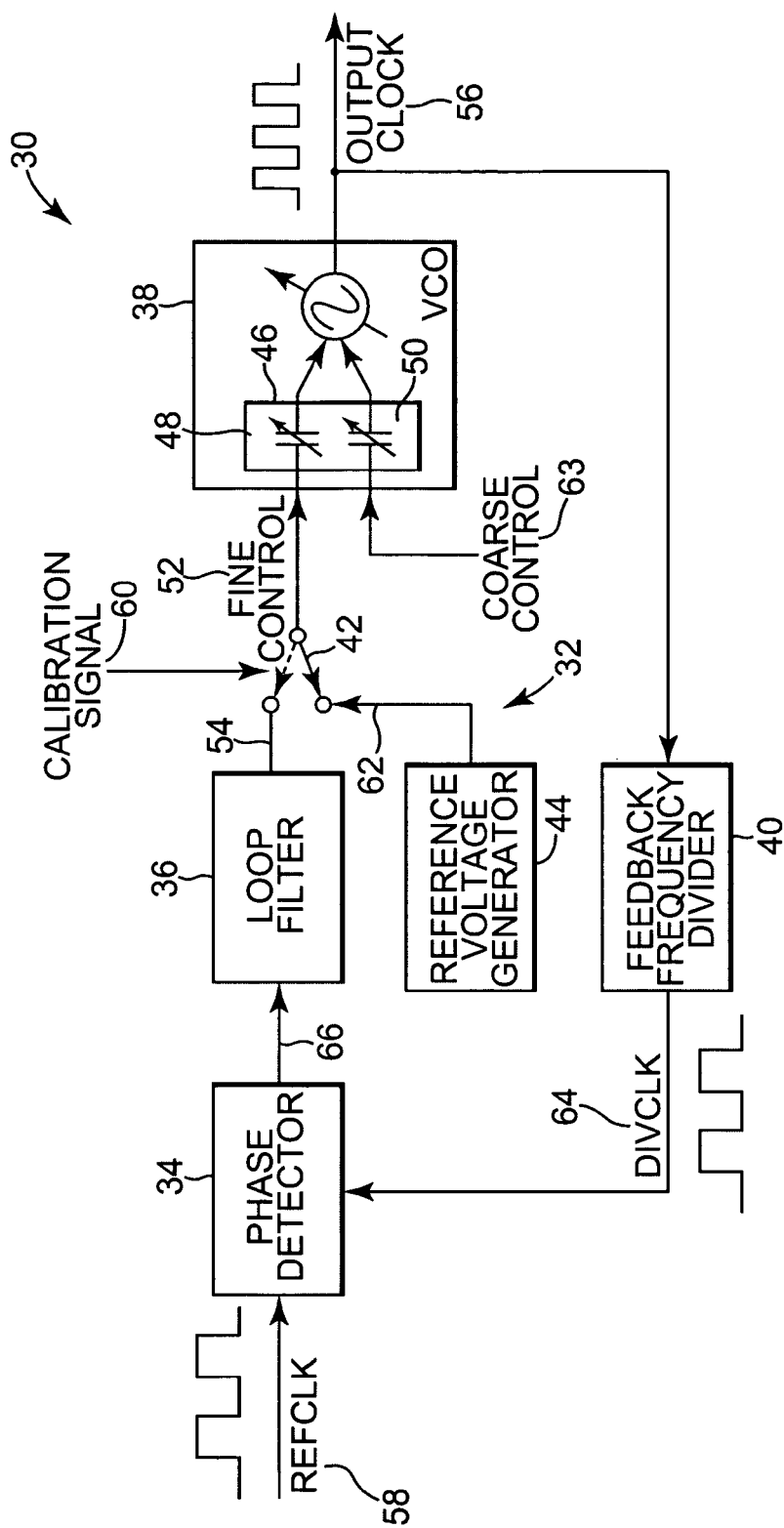
FIG. 1 is a block and schematic diagram illustrating generally a phase-locked loop employing a varactor system according to the present invention.

FIG. 1 is a schematic block diagram illustrating generally one exemplary embodiment of a phase-locked loop (PLL) 30 employing a varactor system 32 according to the present invention. As illustrated, PLL 30 is configured as a frequency multiplier and further includes a phase detector 34, a loop filter 36, a voltage-controlled oscillator 38, a feedback frequency divider 40, and a calibration switch 42. Varactor system 32 further comprises a reference voltage generator 44 and a varactor 46, wherein varactor 46 is configured as a capacitive control element of VCO 38. In one embodiment, reference voltage generator 44 and varactor 46 are located proximate to one another on a substrate, such as silicon. Varactor 46 further includes a first set 48 of voltage-tunable capacitor cells for fine frequency control and a second set 50 of voltage tunable capacitor cells for coarse frequency control of VCO 38, wherein at least the capacitor cells the first plurality of capacitor cells are substantially equal to one another with each having a capacitive range that varies based on a first plurality of operating parameters.

As illustrated, PLL 30 is configured as a frequency, or clock multiplier. During normal operation, calibration switch 42 ties a fine control reference voltage input 52 of first set 48 of capacitive cells to an output 54 of loop filter 36 (as indicated by the dashed arrow), and VCO generates an output clock 56 having a frequency substantially equal to a multiple (N) of a frequency of an input reference clock (REFCLK) 58.

As illustrated by FIG. 1, during a calibration procedure prior to normal operation of PLL 30, a calibration signal 60 causes calibration switch 42 to "open" PLL 30 and tie an output 62 of reference voltage generator 44 to the fine control reference voltage input 52 of the first plurality 48 of voltage-tunable capacitor cells of varactor 46. During the calibration procedure, a coarse control signal 63 is provided to the second plurality 50 of voltage-tunable capacitor cells, wherein coarse control signal 64 has a voltage level causing VCO 38 to generate output clock 56 at a frequency within a frequency capture range that will enable PLL 30 to track the frequency of REFCLK 62 using only the fine control reference voltage at fine control input 52.

During the calibration process, reference voltage generator 44 is configured to provide at output 62 a fine control reference voltage having a voltage level that shifts based on a second plurality of operating parameters which are substantially equal to the first plurality of operating parameters of varactor 46, such that each capacitor cell of the first plurality 48 in response to the input reference voltage level provides a capacitance substantially equal to a midpoint capacitance of the capacitive range of varactor 46. Upon completion of the calibration procedure, calibration signal 60 causes calibration switch 42 to tie fine control input 52 to output 54 of loop filter 36.

During normal operation, as mentioned above, VCO 38 is configured to oscillate at a frequency substantially equal to N times the frequency of REFCLK 46. Feedback frequency divider 40 provides a divided clock (DIVCLK) 64 having a frequency substantially equal to the frequency of output clock 56 divided by N. Phase detector 34 receives REFCLK 58 and DIVCLK 64 and provides an output voltage to loop filter 36 via path 66 that is proportional to a phase difference between REFCLK 58 and DIVCLK 64. Loop filter 36 in-turn provides a filtered output voltage at output 54. During normal operation, the filtered output voltage of loop filter 36 at output 54 functions as the fine control reference voltage to fine control input 52 of the first plurality 48 of voltage-tunable capacitors of varactor 46. When PLL 30 is "locked", the phase of DIVCLK 64 will be substantially equal to the phase of REFCLK 58 and the fine control reference voltage at output 54 remains unchanged.

By providing a fine control reference voltage that centers the first set 48 of capacitive cells with their capacitive tuning range, varactor system 32 according to the present invention provides PLL 30 with maximum bi-directional tunability of VCO 38 during normal operation. Although varactor system 32 is illustrated by FIG. 1 as being part of PLL 30, varactor system 32 can be adapted for use in nearly any application employing a varactor.

Figure 2:
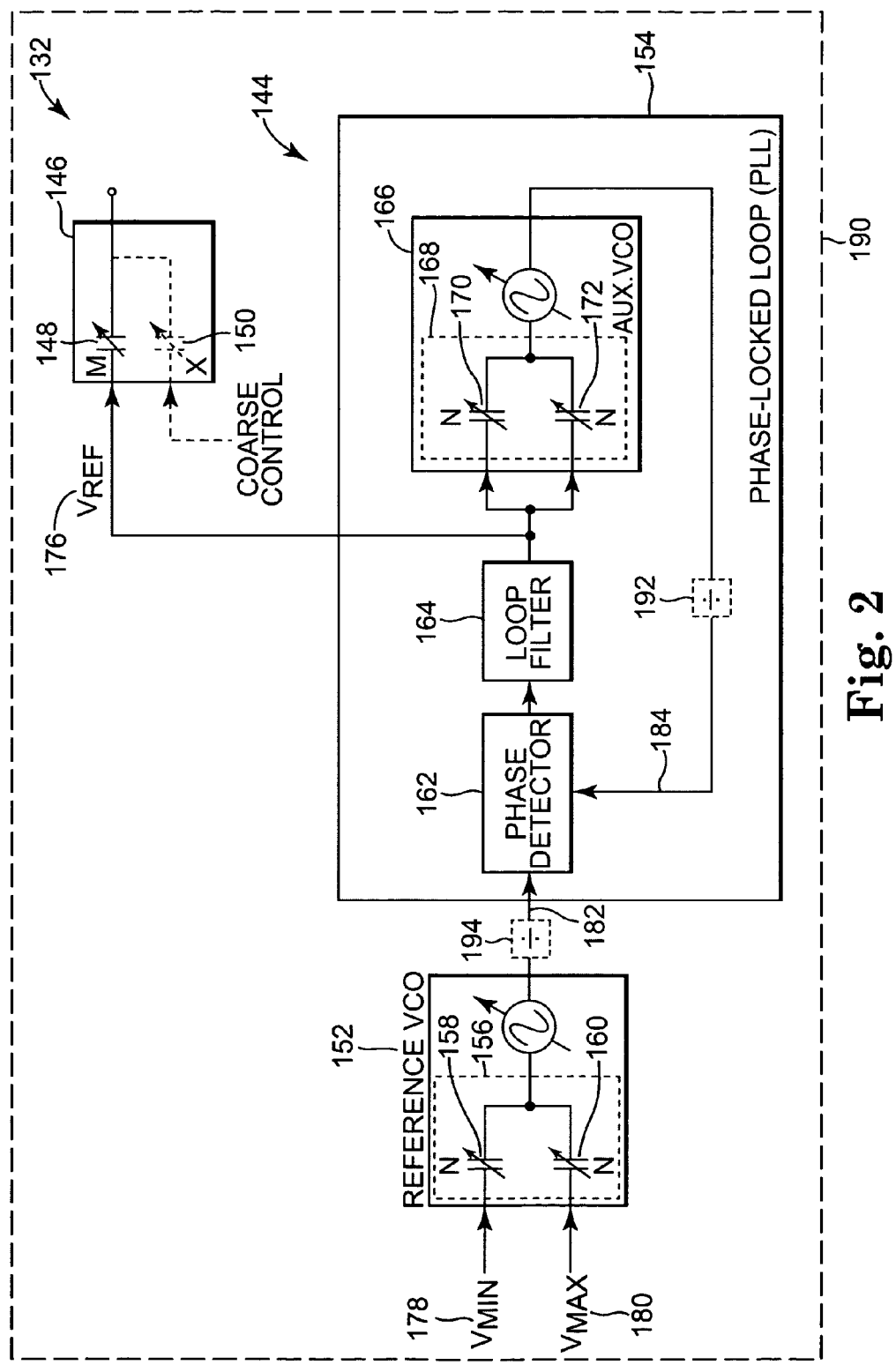
FIG. 2 is a block and schematic diagram illustrating one exemplary embodiment of a varactor system according to the present invention.

FIG. 2 is a block and schematic diagram illustrating one exemplary embodiment of a varactor system 132 according to the present invention. Varactor system 132 includes a reference generator 144 and a primary varactor 146. Primary varactor 146 includes a set of set 148 of M voltage-tunable capacitor cells, with each cell having a capacitive range that may vary due to process, voltage, and temperature (PVT) fluctuations, wherein a total capacitance provided by primary varactor 146 equals the sum of the individual capacitances of the M capacitor cells. In one embodiment, similar to varactor 46 of PLL 30 of FIG. 1, varactor 146 further includes a set 150 of X capacitor cells, wherein each set 148 and 150 is controlled via a separate control voltage.

Reference voltage generator 144 further includes a reference voltage-controlled oscillator (VCO) 152 and a phase-locked loop (PLL) 154. Reference VCO 152 is tuned by a reference varactor 156 having a first set 158 of N voltage-tunable capacitor cells and a second set 160 of N voltage-tunable capacitor cells, wherein the individual cells of first and second sets 158 and 160 are substantially equal to the individual capacitor cells of the set 148 of primary varactor 146.

PLL 154 further includes a phase detector 162, a phase-compensated loop filter 164, and an auxiliary VCO 166. Auxiliary VCO 166 further is tuned by a first set 170 of N voltage-tunable capacitor cells and a second set 172 of N voltage-tunable capacitor cells. As with reference varactor 156, the individual capacitor cells of the first and second sets 170 and 172 of capacitor cells are substantially equal to the individual capacitor cells of the set 148 of N capacitor cells of primary varactor 146.

Varactor system 132 operates as described below to provide a reference voltage ($V_{REF}$) 176 that causes each of the M capacitor cells of set 148 of varactor 146 to provide and maintain a capacitance substantially equal to the midpoint capacitance of their capacitive voltage range in spite of PVT fluctuations. First set 158 of N varactor cells of reference VCO 152 receive a first control voltage ($V_{MIN}$) 178 having a voltage level that forces each of the N capacitor cells of set 158 to provide a capacitance substantially equal to the minimum capacitive value of its capacitive range. Second set 160 of N varactor cells of reference VCO 152 receive a second control voltage ($V_{MAX}$) 180 having a voltage level that forces each of the N capacitor cells of set 160 to provide a capacitance substantially equal to the maximum capacitive value of its capacitive range.

With half of the capacitive cells of reference varactor 156 having their minimum capacitive value and half having their maximum capacitive value, reference varactor 156 necessarily provides a total capacitive value substantially equal to a midpoint value of its net capacitive range. In response, reference VCO 152 provides an input reference frequency at 182 to PLL 154 that substantially corresponds to the midpoint value of the net capacitive range of reference varactor 156, and thus to the midpoint capacitive value of the capacitive range of each of the 2×N individual capacitive cells of sets 158 and 160 of reference varactor 156. Because the individual capacitive cells of sets 158 and 160 of reference varactor 156 are substantially equal to the individual capacitive cells of set 148 of primary varactor 146, the input reference frequency provided at 182 also corresponds to the midpoint capacitive value of the capacitive range of each of the M individual cells of set 148 of primary varactor 146.

The input reference frequency is fed into phase detector 162 and the phase-compensated loop filter provides the analog reference voltage $V_{REF}$ 176. $V_{REF}$ 176 is provided as the control input to set 148 of M capacitor cells of varactor 146 and to sets 170 and 172 of N capacitor cells of auxiliary varactor 168 of auxiliary VCO 166. When phase-lock is achieved by PLL 154, the output frequency and phase at 184 generated by auxiliary VCO 166 will substantially match the input reference frequency and phase at 182 generated by reference VCO 152, and $V_{REF}$ 176 will settle on an intermediate value that causes each capacitor cell of each of the sets 148, 170, and 172 to provide a capacitive value substantially equal to the midpoint capacitance of its capacitive range. Consequently, varactor 146, reference varactor 156, and auxiliary varactor 168 will switch in a total capacitance substantially equal to the midpoint of its capacitive range—its average total tuning capacitance.

In one embodiment, the primary varactor 146, reference VCO 152, and PLL 154 are located proximate to one another on a monolithic substrate 190, such as silicon, such that the capacitive ranges of the individual capacitor cells of primary varactor 146, reference varactor 156, and auxiliary varactor 168 vary similarly due to PVT fluctuations. Thus, as the input reference frequency provided at 182 by reference VCO 152 fluctuates over PVT, PLL 154 will drive auxiliary VCO 166 to track the input reference frequency by adjusting $V_{REF}$. As a result, the level of $V_{REF}$ varies such that primary varactor 146 provides a total capacitance over PVT that is substantially equal to its average total tuning capacitance. In one embodiment, when the reference frequency and feedback frequencies are at a level too high to be compared in a practical monolithic silicon implementation, substantially equal first and second frequency dividers 192 and 194 are included as illustrated.

As a result, in one embodiment, when primary varactor 146 is employed as the tuning element in the VCO of a PLL, such as varactor 46 of VCO 38 of PLL 30 as illustrated in FIG. 1 (with set 148 being employed for fine control and set 150 for course control), $V_{REF}$ 176 applied to primary varactor 146 during a calibration procedure will substantially maximize the bi-directional tuning of the PLL.

Varactor system 132 according to the present invention naturally generates a reference voltage that substantially centers varactor 146 (only first set 148 of capacitive cells when varactor 146 also includes second set 150) on its net capacitive tuning range. Furthermore, varactor system 132 employs feedback to track PVT fluctuations in varactor 146, reference varactor 156, and auxiliary varactor 168. Thus, there is no need to incorporate a voltage divider that "guesses" to correct voltage as employed by some conventional techniques. Finally, varactor system 132 is self-calibrating and does not require a complex algorithm to generate the reference as required by other calibrating techniques.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
    a principal varactor including a set of substantially equal voltage-tunable capacitor cells, each having a capacitive range that varies with a first plurality of operating parameters and each providing a capacitance within the range based on a voltage level of a reference voltage; and
    a voltage generator configured to provide the reference voltage, wherein the voltage level of the reference voltage corresponds to a desired capacitance within each of the capacitive ranges and varies based on a second plurality of operating parameters which are substantially the same as the first plurality of operating parameters, and wherein the voltage level of the reference voltage causes each capacitor cell to provide substantially the desired capacitance.

2. The system of claim 1, wherein the varactor and the voltage generator are located proximate to one another on a substrate.

3. The system of claim 2, wherein the substrate is silicon.

4. The system of claim 1, wherein the desired capacitance is substantially equal to a midpoint of each of the capacitive ranges.

5. The system of claim 1, wherein a net capacitance of the principal varactor is substantially equal to a sum of the capacitances of the individual capacitor cells of the plurality.

6. The system of claim 1, wherein the voltage generator further comprises:
    a phase-locked loop (PLL) configured to provide the reference voltage, wherein the voltage level of the reference voltage varies based on the reference frequency.

7. The system of claim 6, wherein the reference VCO further includes a reference varactor comprising:
    a first set of voltage-tunable capacitor cells, each substantially equal to the voltage-tunable capacitor cells of the principal varactor and receiving a first control voltage having a level causing each capacitor cell to provide a capacitance substantially equal to a minimum capacitance of the capacitive range; and
    a second set of voltage-tunable capacitor cells, each substantially equal to the voltage-tunable capacitor cells of the principal varactor and receiving a second control voltage having a level causing each capacitor cell to provide a capacitance substantially equal to a maximum capacitance of the capacitive range, wherein the capacitive ranges of each voltage-tunable capacitor cell of the first and second sets of voltage-tunable capacitors cells vary based on the second plurality of operating parameters.

8. The system of claim 7, wherein the first and second sets of voltage-tunable capacitor cells comprise an equal number of capacitor cells such that a net capacitance of the reference varactor has a net capacitive value substantially equal to a midpoint capacitive value of a net capacitive tuning range of the reference varactor.

9. The system of claim 8, wherein in response to the reference varactor having a net capacitive value substantially equal to the midpoint of its net capacitive tuning range, the reference VCO generates a reference frequency corresponding to a midpoint capacitive value of the capacitive range of each capacitive cell of the first and second sets of the reference varactor and of each capacitive cell of the set of capacitive cells of the principal varactor.

10. The system of claim 7, wherein the PLL further comprises:
an auxiliary VCO configure to provide a feedback frequency based on the reference voltage;
a phase detector configured to provide a control voltage corresponding to a phase difference between the reference frequency and the feedback frequency; and
a loop filter configured to filter the control voltage to provide the reference voltage.

11. The system of claim 10, wherein the auxiliary VCO further includes an auxiliary varactor, the auxiliary varactor comprising:
a set of voltage-tunable capacitor cells, each substantially equal to the voltage-tunable capacitor cells of the principal varactor, and having a capacitive range that varies based on a third plurality of operating parameters substantially the same as the second plurality of operating parameters, wherein each of the voltage-tunable capacitor cells of the auxiliary varactor provides a capacitance based on the voltage level of the reference voltage.

12. The system of claim 11, wherein a number of capacitive cells comprising the set of capacitive cells of the auxiliary VCO is equal to a sum of a number of cells comprising the first and second sets of the reference VCO.

13. The system of claim 10, wherein the PLL further comprises:
a first frequency divider positioned between the auxiliary VCO and the phase detector and configured to divide the feedback frequency by a divider value; and
a second frequency divider substantially the same as the first frequency divider positioned between the reference VCO and the phase detector and configured to divide the reference frequency by the divider value.

14. The system of claim 1, further comprising:
a phase-locked loop including a voltage-controlled oscillator (VCO), wherein the varactor comprises a tuning element of the VCO.

15. A voltage generator for a principal varactor including a plurality of substantially equal voltage-tunable capacitor cells, each having a capacitive range that varies based on a first plurality of operating parameters and each providing a capacitance within the range based on a reference voltage, the voltage generator comprising:
a voltage-controlled oscillator (VCO) configured to provide a reference frequency corresponding to a desired capacitance within each of the capacitive ranges, wherein the reference frequency varies based on a second plurality of operating parameters which are substantially the same as the first plurality of operating parameters; and
a phase-locked loop (PLL) configured to provide the reference voltage, wherein the reference voltage varies based on the reference frequency and causes each capacitor cell to provide substantially the desired capacitance.

16. The voltage generator of claim 15, wherein the VCO further comprises:
a reference varactor having a plurality of voltage-tunable capacitor cells, each capacitor cell being substantially the same as the voltage-tunable capacitor cells of the principal varactor.

17. The voltage generator of claim 16, wherein the PLL further includes an auxiliary VCO, the auxiliary VCO comprising:
a reference varactor having a plurality of voltage-tunable capacitor cells, each capacitor cell being substantially the same as the voltage-tunable capacitor cells of the principal varactor.

18. The voltage generator of claim 17, wherein a net capacitance of the reference varactor is substantially equal to a net capacitance of the auxiliary varactor.

19. The voltage generator of claim 15, wherein the principal varactor, the voltage-controlled oscillator, and the phase-locked loop are located proximate to one another on a substrate so as to experience a substantially same plurality of operating parameters.

20. A voltage generator for a varactor including a plurality of substantially equal voltage-tunable capacitor cells, each having a capacitive range that varies based on a first plurality of operating parameters and each providing a capacitance within the range based on a reference voltage, the voltage generator comprising:
a voltage controlled oscillator configured to provide a reference frequency corresponding to a desired capacitance within each of the capacitive ranges; and
a phase-locked loop configured to provide the reference voltage, wherein the reference voltage varies based on the reference frequency and based on a second plurality of operating parameters which are substantially the same as the first plurality of operating parameters and causes each capacitor cell to provide substantially the desired capacitance.

21. A method of operating a first varactor including a plurality of substantially equal voltage-tunable capacitor cells, each having a capacitive range that varies with a first plurality of operating parameters and each providing a capacitance within the capacitive range based on a reference voltage, the method comprising:
providing a reference frequency corresponding to a desired capacitance within each of the capacitive ranges, wherein the reference frequency varies based on a second plurality of operating parameters substantially equal to the first plurality of operating parameters; and
providing the reference voltage, wherein the reference voltage varies based on the reference frequency and causes each capacitor cell to provide substantially the desired capacitance.

22. The method of claim 21, wherein providing the reference frequency further comprises:
providing a reference voltage-controlled oscillator (VCO) having a reference varactor including a first set of voltage-tunable capacitor cells and a second set of voltage-tunable capacitor cells, wherein the capacitor cells of the first and second sets are substantially the same as the voltage-tunable capacitor cells of the first varactor and have capacitive ranges that vary based on the second plurality of operating parameters, and wherein the reference VCO provides the reference frequency based on the capacitance fo the first and second sets of voltage-tunable capacitor cells.

23. The method of claim 22, wherein providing the reference frequency further comprises:
providing the first and second sets with an equal number of voltage-tunable capacitor cells;
driving the first set of voltage tunable capacitor cells such that each capacitor cell provides a capacitance substantially equal to a minimum capacitance of its capacitive range;
driving the second set of voltage tunable capacitor cells such that each capacitor cell provides a capacitance substantially equal to a maximum capacitance of its capacitive range.

24. The method of claim 22, wherein providing the reference voltage further comprises:
providing the reference frequency to a phase-locked loop (PLL) including an auxiliary VCO having an auxiliary varactor, wherein the auxiliary varactor comprises a set of voltage-tunable capacitor cells substantially the same as the voltage-tunable capacitor cells of the first varactor, and wherein a net capacitance of the auxiliary varactor is substantially equal to a net capacitance to the reference varactor; and
providing the reference voltage from an output of a loop filter of the PLL.

25. The method of claim 24, further comprising:
locating the first varactor, the reference VCO, and the PLL in proximity to one another on a monolithic substrate.

* * * * *

UNITED STATES PATENT AND TRADEMARK OFFICE
CERTIFICATE OF CORRECTION

PATENT NO. : 6,975,176 B2  
APPLICATION NO. : 10/717834  
DATED : December 13, 2005  
INVENTOR(S) : Alvin Leng Sun Loke et al.

It is certified that error appears in the above-identified patent and that said Letters Patent is hereby corrected as shown below:

Column 6, Line 45, Claim 6, after "comprises:"

insert -- a reference voltage-controlled oscillator (VCO) configured to provide a reference frequency corresponding to the desired capacitance, wherein the reference frequency varies based on the second plurality of operating parameters; and --;

Column 9, Line 1, Claim 22, after "capacitance" delete "fo" and insert -- of --.

Signed and Sealed this
Twenty-sixth Day of February, 2013

Teresa Stanek Rea
*Acting Director of the United States Patent and Trademark Office*